United States Patent [19]

Beelitz

[11] 4,251,742
[45] Feb. 17, 1981

[54] CURRENT SOURCE, AS FOR SWITCHING PIN DIODES

[75] Inventor: Howard R. Beelitz, Gillett, Pa.

[73] Assignee: RCA Corporation, New York, N.Y.

[21] Appl. No.: 28,367

[22] Filed: Apr. 9, 1979

[51] Int. Cl.³ .................... H03K 3/26; H03K 23/14
[52] U.S. Cl. .................................. 307/270; 307/254; 307/317 R; 307/320
[58] Field of Search .................. 307/317 R, 319, 320, 307/296, 270, 254

[56] References Cited

U.S. PATENT DOCUMENTS

| 3,868,517 | 2/1975 | Schoeff | 307/319 |
| 4,019,152 | 4/1977 | Harwood et al. | 307/320 |

OTHER PUBLICATIONS

"Integrated Circuit Eng. Bttn" Part No. UDS5790/H/UDS5791H Sprague Elec. Company Semiconductor Div.

Primary Examiner—Stanley D. Miller, Jr.
Assistant Examiner—B. P. Davis
Attorney, Agent, or Firm—E. M. Whitacre; A. L. Limberg; A. J. Jacobson

[57] ABSTRACT

A current driver circuit using a two-level current source for switching PIN diodes. The driver is responsive to a binary signal control voltage for providing a respective forward-bias current or reverse-bias voltage. The two-level current source, responsive to output voltage, is included in the driver circuit to supply one of two current levels when the driver is conditioned to forward-bias the diode. When the output voltage is below a predetermined threshold value, a first level of current is supplied; when the output voltage is above the predetermined value, a second level of current, generally larger than the first current, is provided. The disclosed technique reduces peak instantaneous power dissipation in the driver by avoiding the simultaneous condition of high voltage and high current.

8 Claims, 4 Drawing Figures

CURRENT SOURCE, AS FOR SWITCHING PIN DIODES

This invention relates to current drivers, and more particularly this invention relates to current drivers for supplying load means output current levels responsive to the output voltage therefrom.

Certain types of load devices require drivers that must meet stringent operating conditions. One example of such load device is a PIN diode.

A PIN diode is a solid state device comprising a region of P-type material, a region of intrinsic material, and a region of N-type material. Such diodes are useful in radio frequency (RF) applications as voltage-controlled switches and voltage-controlled phase shifters. The particular characteristic of the PIN diode that makes the device useful in RF circuits is that the impedance of the PIN diode is determined by the resistivity of the intrinsic region, which is in turn controlled by its direct current (DC) bias conditions. When reverse biased, a PIN diode is a high impedance to RF; when forward biased, a PIN diode is a low impedance to RF.

Furthermore, PIN diode impedance is determined by DC conditions even when the peak RF voltage across the diode is greater than the DC bias voltage. Normally, any potential applied opposite to the DC bias voltage tends to reverse the diode state. However, at sufficiently high frequencies, (where the period between cycles is small compared to the effective lifetime of the charge carriers) there is not sufficient time between cycles to change the resistivity of the intrinsic region. Therefore, a given DC bias voltage may switch RF signals having a peak voltage in excess of the bias voltage. See "Microwave Semiconductor Devices," pp. 134-150, H. V. Shurmer, published 1971 by Wiley-Interscience, New York, N.Y., for a discussion of PIN diode characteristics.

PIN diode drivers, of the type described herein, are used in a phased-array radar system wherein the "antenna pattern"—i.e. the pattern of radiated electromagnetic field intensity is determined by the superposition of the fields of thousands of individual radiators. By controlling the phase shift of the individual radiators, the resulting beam may be electronically pointed in any direction. One can appreciate that an application such as a phased-array radar requires thousands of PIN diode drivers. It is therefore highly desirable to design such drivers so that they are readily manufacturable in integrated circuit form.

A driver is subjected to greatest electrical stress when switching a PIN diode from reverse bias to forward bias. In the reverse bias condition, the diode is essentially capacitive, storing charge at the reverse bias voltage. The driver must first remove the stored charge in order to forward-bias the diode. At the instant of switching from steady-state reverse-bias to forward charging, the driver is subjected to a high-current, high-voltage condition.

A limiting factor in reducing transistor device sizes in an integrated circuit is the peak power dissipation. For example, in switching a PIN diode, as described above, assume the driver source is a constant forward current of 100 ma and the reverse bias voltage is set at 40 volts. When the driver switches from the reverse-bias condition to the capacitive-charging "forward" condition, the instantaneous power dissipation is 4 watts. In the steady state, the voltage across the driver output transistor is approximately 0.8 volts, and the power dissipation is only 0.08 watts. A reduction in peak power dissipation during switching will facilitate a reduction in device sizes and therefore a reduction in chip size.

A prior art example of a PIN driver in integrated circuit form is a quad driver manufactured by Sprague Electric Company, North Adams, Mass., part no. UDS5790H. The reverse bias voltage is not conducted through the chip, but is supplied to the PIN diode through an external resistor. When switching from reverse-bias to forward-bias the driver must sink both forward diode current plus current from the external resistor. It can be seen that this arrangement increases both peak and steady-state power dissipation.

The present invention reduces power dissipation in a current driver to drive a load means such as a PIN diode. In one embodiment, peak current is reduced by using a two-level current source responsive to voltage output to limit power dissipation in the driver. A voltage sensing means, connected to the output terminal and to the two-level current source, controls the output current level. When the output voltage is below a predetermined threshold value, a first level of current is supplied to remove stored charge from the diode; when the output voltage is above said predetermined threshold value, a second, somewhat larger, current is supplied to forward-bias the diode. More than two current levels may be used to further reduce peak power levels.

Accordingly, the invention is embodied in a plural-level current source wherein the output current level therefrom is responsive to output voltage.

IN THE DRAWINGS

Figure 2:
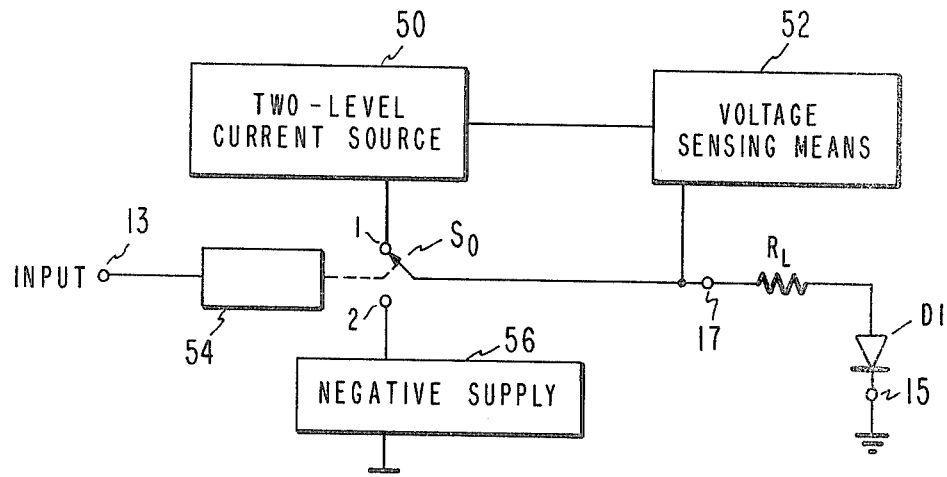
FIG. 2 is a block diagram of the circuit of FIG. 1 presenting the invention in conceptual form.

The invention may be best understood by reference to the block diagram of FIG. 2. A PIN diode D1 and series resistor $R_L$ are connected between a reference terminal 15 shown as being grounded, and an output terminal 17. Switch means $S_O$ selectively connects output terminal 17 to a two-level current source 50 or to a negative voltage supply 56. The selective connection afforded by switch means $S_O$ is controlled by the input signal 13 through the input control means 54. A first level of binary control signal on input 13 conditions switch $S_O$ to connect output terminal 17 to the negative voltage supply 56. This reverse biases diode D1. It will be understood that supply 56 may instead provide a positive voltage, if the polarity of the diode D1 is reversed. A second level of binary control signal conditions switch $S_O$ to connect output terminal 17 to a two-level current source 50.

The two-level current source 50 provides current of a polarity to forward bias diode D1. The two-level current source 50, in combination with the voltage sensing means 52, is a dual-mode current source which supplies one of two levels of forward bias output current in response to output voltage. If the voltage on output terminal 17 is below a predetermined threshold value, then the two-level source 50 is conditioned to supply a first level of output current. If the output voltage on terminal 17 is above said predetermined threshold value, then voltage sensing means 52 will condition the two-level current source 50 to conduct a second level of output current, which second level of output current is larger than the first level.

In operation, assume the input 13 is high. Switch $S_O$ is in position 2, connecting the negative supply 56 so as to reverse bias diode D1. A typical value for the negative supply is −40 volts. When reverse biased, a PIN diode is essentially a capacitive load storing charge at the reverse bias voltage. Assume input 13 now goes low. Switch $S_O$ changes to position 1, connecting the two-level current source so as to forward bias diode D1.

The voltage sensing means 52 monitors the voltage on the output terminal 17 and detects the predetermined threshold voltage. For purposes of illustration, assume that the predetermined threshold voltage is zero volts respective to ground. Initially, since a negative voltage is stored in the diode capacitance, the voltage sensing means 52 conditions the two-level current source 50 to supply a first level of output current. By way of illustration, assume the first level of current is 10 milliamperes. A substantially constant current of 10 milliamperes is now supplied in a direction so as to discharge the charge stored in diode D1. The voltage on terminal 17 rises as charge is removed. When the voltage on output terminal 17 equals the threshold voltage, in this example zero volts, voltage sensing means 52 conditions the two-level current source 50 to supply a second level of output current, say 100 milliamperes. Diode D1 is carried into forward conduction and maintained at 100 milliamperes forward-bias.

When the input 13 again goes high, switch $S_O$ will again be connected to terminal 2. The negative supply voltage will drain off charge from the intrinsic region of the PIN diode D1. After the initial surge current, the steady-state current will be small, equal to the leakage current of the diode D1.

As previously mentioned, the RF impedance of the PIN diode D1 is determined by its DC bias conditions. A PIN diode can be used to control an RF signal by physically mounting the diode in a transmission line. For example, to control phase shift, a branch-line hybrid junction is terminated by a pair of diodes. The DC control introduces or removes a discrete RF phase shift.

Note that the two-level current source 50 is at no time subject to simultaneous application of high voltage and high current. When the reverse biased diode D1 is initially switched to the current source 50, applying −40 volts thereto, the output current is only 10 milliamperes. After the diode voltage falls to zero volts, then the output current increases to 100 milliamperes. Therefore, the need for the driver circuitry to simultaneously supply both high voltage and high current is avoided, reducing the dissipation that must occur within the driver circuitry.

One can reduce the peak power dissipation still further by using more than two levels of current responsive to output voltage therefrom. For example, one can use a three level current source responsive to a voltage sensing means to supply one of three different current levels depending on the value of the output voltage. Generally, higher current is matched with lower voltage to minimize power dissipation. As discussed hereinafter, a plurality of two-level current sources may be cascaded to form one plural-level current source.

Figure 3:
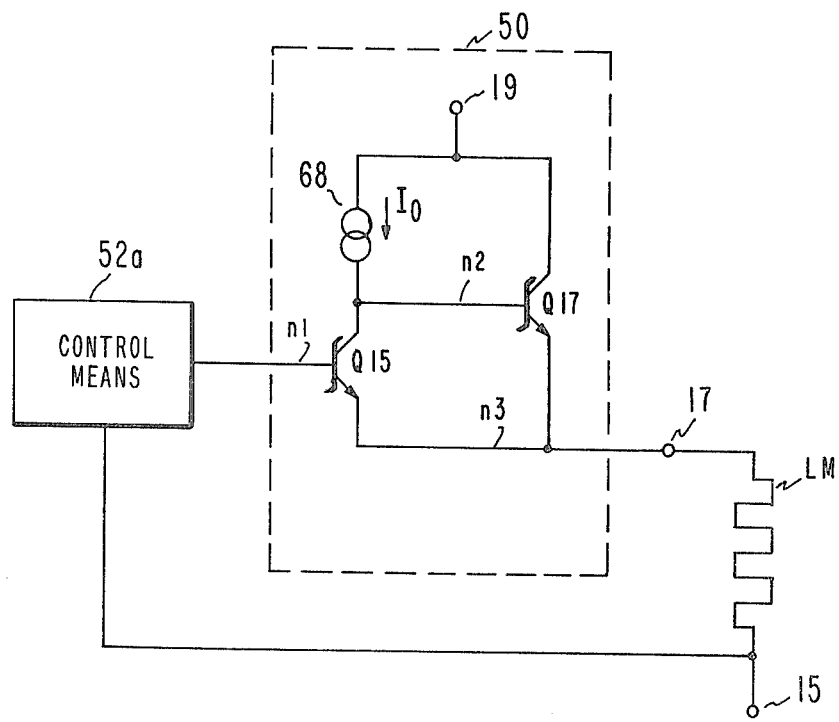
FIG. 3 is a schematic diagram, partially in block form, of circuitry including a two-level current source.

As shown in FIG. 3, the two-level current source 50 may, for example, comprise output transistor Q17, constant current source 68, and transistor Q15. For purposes of increased switching speed, Q15 and Q17 are shown as Schottky clamped transistors. It is understood that non-Schottky clamped transistors may also be used. The transistor Q15 is used as a switch means responsive to a control voltage on node n1 for connecting circuit node n2 to circuit node n3. For this purpose, another switching device may replace transistor Q15. The control means 52a provides a means for switching Q15 on and off responsive to the potential at output terminal 17. Terminal 19 is suitable for connecting to a source of operating potential. Terminal 15, shown connected to one end of the load means LM, is of a type suitable for connection to a source of reference potential. The potentials on terminal 19 and terminal 15 may be any appropriate values so long as the resulting potential difference therebetween is within the active operating range of the transistors.

The circuit of FIG. 3 provides two levels of output current to load means LM as follows: When transistor Q15 is on, the current $I_0$ from source 68 is delivered directly to the load means LM, providing a first level of output current. The conduction of Q15 clamps the emitter-base junction of Q17, and this maintains Q17 non-conductive. When transistor Q15 is off, $I_0$ is applied as base current to Q17 and is conducted through the base-emitter junction of Q17. Responsive to this $I_0$ base current, Q17 conducts a collector current larger than $I_0$ by a factor $\beta$, the common-emitter current gain of Q17. In accordance with Kirschoff's Law of Currents Q17 supplies an emitter current equal to the sum of its base and collector currents—i.e. $(\beta+1)I_0$—to the load means LM.

The control means 52a may be any appropriate apparatus, responsive to the potential on output terminal 17, to switch Q15 at the appropriate time. However, the control function is readily provided by means which fixes, or clamps, a maximum limit voltage at the base of transistor Q15, respective to the voltage at terminal 15, equal to a predetermined limit voltage. The control means 52a, therefore, while allowing node n1 to be less than the limit voltage, prevents node n1 from going more positive than the limit voltage.

When the output voltage on terminal 17 is less than the limit voltage on node n1 by an amount greater than the forward biased base-emitter voltage drop of Q15, then Q15 is on. As the output voltage is increased, past the threshold voltage, Q15 begins to turn off. When the output voltage is equal to or greater than the limit voltage at node n1, Q15 is completely off. Therefore, by appropriate selection of the limit voltage at n1, the threshold voltage above which Q15 begins to turn off can be conveniently set at any desired value.

As previously mentioned, transistors Q15 and Q17 combined with current source 68 may constitute the two-level current source 50. Note, however, that transistor Q15 combined with control means 52a also may constitute the voltage sensing means 52 (FIG. 2). Therefore, transistor Q15 may advantageously be used as a common element to both the two-level current source 50 and the voltage sensing means 52.

Figure 4:
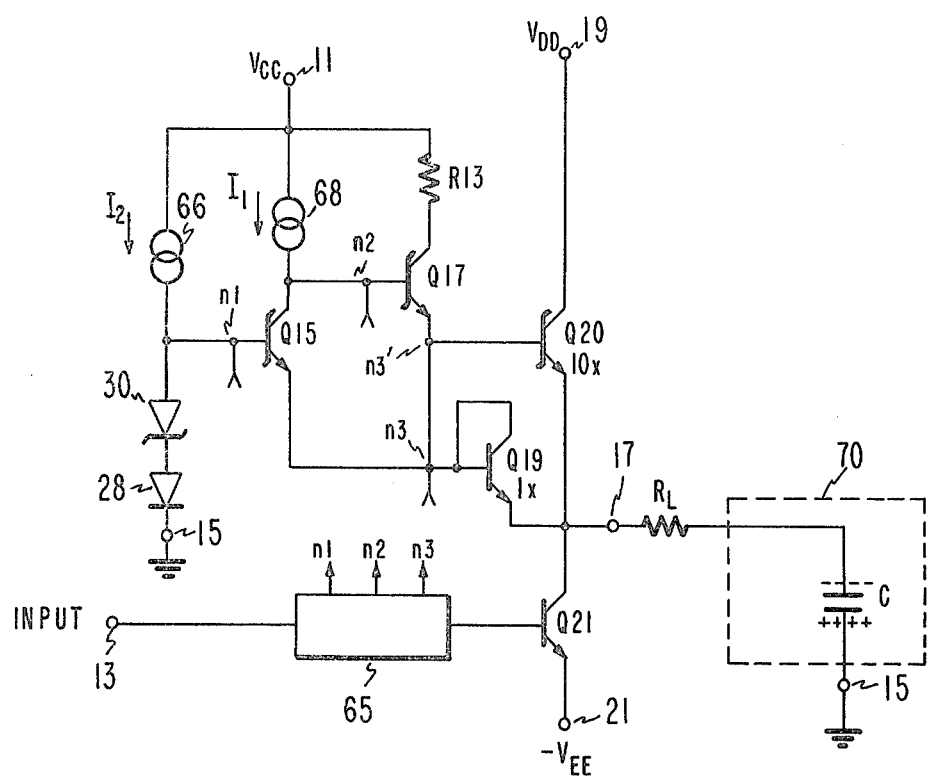
FIG. 4 is a schematic diagram, partially in block form, embodying a two-level current source arranged in combination with the other elements for providing a complete PIN driver embodying the present invention.

FIG. 4 shows the circuit of FIG. 3 in combination with other elements to form a complete PIN diode driver. The load means, which might for example be a reversed biased PIN diode, is indicated to be an essentially capacitive element 70. Resistor $R_L$ is for current limiting.

The control means for providing a limit voltage comprises two diodes 28, 30 connected serially between node n1 and terminal 15, and forward-biased by the current $I_2$ supplied from current source 66. (Current source 66 may, be way of example, simply comprise a resistor between terminal 11 and node n1.) Diode 30 is a Schottky diode having a forward bias voltage drop of about 0.4 volts. Diode 28 is a conventional diode having a forward bias voltage drop of about 0.7 volts. Since the current source 66 maintains a substantially constant forward current $I_2$, the diodes 28, 30 limit the most positive potential at node n1 equal to about $0.4+0.7=1.1$ volts. The potential at the base of transistor Q15 actually "tracks" the output potential at node 17, offset by the base-emitter voltage drops of Q15 and Q19 at all output potentials below the threshold voltage. The function of diodes 28, 30 are to limit the most positive potential at node n1 to the above-mentioned 1.1 volts, thereby setting the desired threshold voltage.

Resistor R13, included in the collector circuit of Q17, reduces sensitivity to deviation of the $\beta$ of Q17 from manufacturing norm in that the maximum collector current of Q17 is limited by R13 in accordance with Ohm's Law rather than dependency on the $\beta$ of Q17 As an alternative embodiment, a diode connected transistor would be connected across the base-emitter junction of Q17. The resulting current mirror would effect the required current multiplication substantially independent of the $\beta$ of Q17.

Output current from Q17 is amplified by a conventional current mirror amplifier (CMA) pair, Q19 and Q20. Since transistors Q19 and Q20 are fabricated on a common substrate by the same manufacturing steps, their respective $I_c$ versus $V_{be}$ characteristics will track each other. The gain of the current mirror is determined by the ratio of the emitter base junction area of Q20 to that of Q19; in this circuit, 10:1. Therefore the approximate current gain is 10.

An important driver performance parameter is the ratio of high output current $I_H$ to low output current, $I_L$. Several factors must be balanced in selecting $I_L$ and $I_H$. The larger $I_H$, the lower the resistivity of the PIN diode. (The resistivity requirement is determined by the RF circuit requirement). The smaller $I_L$, the longer it will take to switch the diode since discharge time is proportional to the time integral of $I_L$. The minimum switching time determines a lower limit on $I_L$. Finally, the smaller $I_L$, the greater the savings in peak power dissipation. Therefore, high output current $I_H$ must be large enough to forward bias the PIN diode to an adequately low resistivity level. Low output current $I_L$ must be small enough to effect a significant power reduction, but also large enough to effect a reasonable discharge time. In the embodiment shown, $I_H=100$ ma, $I_L=10$ ma, resulting in a current ratio of 10. Peak power dissipation during discharging will be reduced approximately by an order of magnitude.

Figure 1:
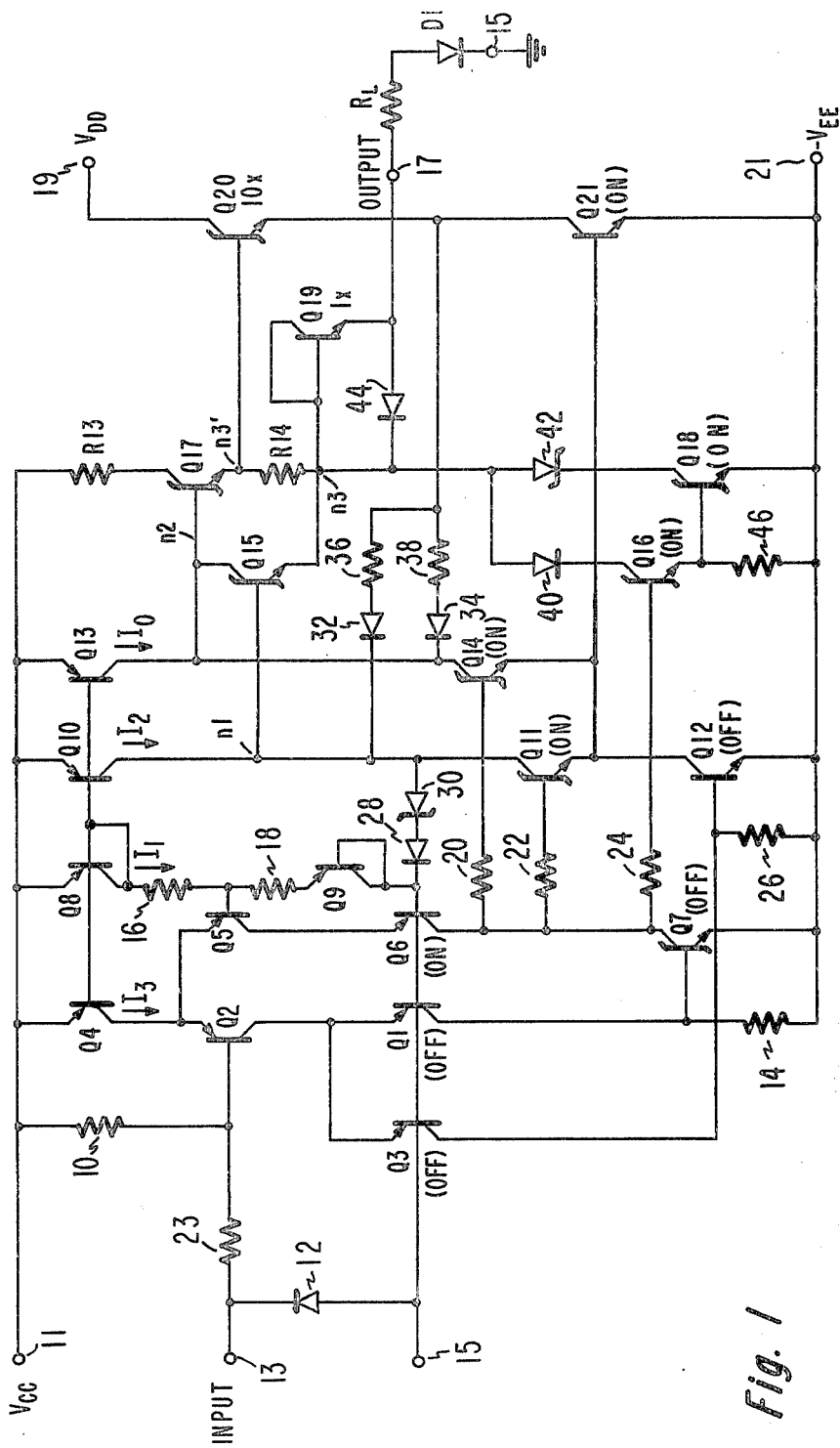
FIG. 1 is a schematic diagram of a PIN diode driver embodying the present invention.

In practice, achieving high to low current ratio of 10 or more presents a problem. Output transistor Q20 tends to saturate for low output voltages and for higher output currents. As a result, the achievable ratio of high to low current is reduced. In order to increase the current ratio, one can make the emitter-base junction area of transistor Q20 larger relative to Q19. However, this will increase circuit size. Another approach, which has the effect of increasing the high to low current ratio without increasing device sizes is to interpose a resistor R14 between circuit node n3 and n3' as shown in FIG. 1. When Q15 is on, R14 (FIG. 1) is in series with the base of Q20 where its degenerative effect is negligible. That is, CMA pair Q19, Q20 has a current gain of about 10, as before. However, when Q15 is off, R14 is in series with the base of Q19, where its effect is to greatly increase the gain of the CMA pair Q19, Q20. In this state, the CMA has a gain of about 20.

Referring back to FIG. 4, transistor Q21 is a switch means for connecting the reverse bias supply $V_{EE}$ to the output terminal 17. Input control means 65 is responsive to a binary control signal on terminal 13 to switch Q21 on or off. When Q21 is on, input control means 65 turns Q15, Q17 and Q19 off by holding nodes n1, n2, and n3 low. When Q21 is switched off, nodes n1, n2, n3 are also released, allowing the dual-mode current source to first discharge and then forward bias the diode load means as described above. Representative circuitry for carrying out the input control function will subsequently be discussed in connection with FIG. 1.

While FIG. 4 shows the collector of Q20 connected to a separate supply, it will be understood that this arrangement is for convenience only and terminal 19 ($V_{DD}$) may be connected in common with terminal 11 ($V_{CC}$).

The predetermined threshold voltage at which the circuit of FIG. 4 begins to switch from low to high level current is equal to the voltage reference at n1 (1.1 volts) minus the $V_{be}$ of Q15 and Q19 (about 0.7 volts each). Therefore, at an output voltage of $1.1-1.4=-0.3$ volts the driver output will begin to increase towards the high level current.

FIG. 1 shows a complete schematic for a PIN diode driver. A logical place to begin tracing cause and effect is at the master current path comprising the series connection of resistor 16 and 18, and the diode-connected transistors Q8 and Q9 at top left center of the figure. Since this master path is connected between $V_{CC}$ and ground, the current is independently determined by its total impedance. Each of transistors Q4, Q10, and Q13 are slave transistors in a current mirror configuration with master transistor Q8. Resistors 16 and 18 are chosen so that the base of Q5 is held at a reference voltage approximately $V_{CC/2}$. This value will determine the input switching point for the driver. Transistors Q5 and Q2 are connected in emitter-coupled configuration for comparing the voltage at the base of Q2, derived from the input signal voltage applied at input terminal 13 by the potential divider action of resistors 23 and 10, against the reference voltage at the base of Q5. Diode 12 is for input protection.

Aside from the current driver component parts previously discussed, the remainder of the components in FIG. 1 are an embodiment of the input control means shown as a block 65 in FIG. 4. The purpose of the input control means is to connect the reverse-bias supply, while disabling the two-level current source, when the driver input is high, and vice-versa when the driver input is low. Each of the transistors in FIG. 1 used for input control—i.e. Q1, Q3, Q6, Q7, Q11, Q12, Q14, Q16, Q18—is labeled to show its condition when the PIN diode driver is supplying a reverse bias output voltage. Note that nodes n1, n2, and n3 are held low by Q11, Q14, and Q18 (as well as Q16) respectively. Therefore, the two-level current source is disabled when reverse bias is being supplied.

When the input 13 goes low, Q2 turns on and Q5 turns off. Transistors Q1, Q3, Q7 and Q12 are switched into conduction, and transistors Q6, Q11, Q14, Q16 and Q18 are switched out of conduction. Transistor Q21 disconnects the reverse bias supply from the output. Nodes n1, n2, and n3 are released, enabling the two-level current source to supply current to the load.

Diodes 32 and 34 used in conjunction with resistors 36 and 38 bootstrap Q11 and Q14 respectively for faster switching and higher current drive to Q21. Diode 44 allows Q19 to be turned off without exceeding a reverse base-emitter voltage of one diode junction voltage drop. Transistors Q7, Q11, Q14, Q15, Q16, Q17, Q18, and Q20 are shown provided with respective Schottky clamp diodes. Those skilled in the art will recognize that resistors 14, 20, 22, 24, 26 and 46 are readily selected to provide a suitable input current to their respective associated transistors.

Typical voltages for the circuit of FIG. 1 are given in the Table I below,

TABLE I

| $I_{OUT}$ | $V_{D1}$ | $V_{OUT}$ | n3 | n3' | n1 |
|---|---|---|---|---|---|
| 10 ma | −.45 | −.3 | .4 | .392 | 1.1 |
| 100 ma | 0.7 | 2.2 | 2.9 | 3.0 | 1.1 | where $I_{OUT}$ is the current through the PIN diode, $V_{D1}$ is the voltage across the diode, $V_{OUT}$ is the driver output voltage on terminal 17, and n1, n3, and n3' are internal circuit nodes. For this example $R_L=15\Omega$, $V_{DD}=3$ volts, $V_{CC}=5$ volts and $-V_{EE}=-40$ volts.

The first line of Table I indicates circuit conditions just before Q15 switches off, i.e., according to the table, when the diode voltage reaches −0.45 V, Q15 begins to turn off. At that time, $I_{OUT}$ is 10 milliamperes and the voltage drop across $R_L$ is 0.15 volts. Note the direction of current through R14 is from n3 to n3'.

In the steady state, the diode current is 100 ma as indicated by the second line of the table. Now the direction of current flow through R14 is from n3' to n3 which boosts the base voltage drive to transistor Q20.

As can be seen from the foregoing embodiment, the driver current to the diode during discharging the charge stored in the diode capacitance is reduced by approximately an order of magnitude. Therefore, the power dissipation during the same discharge period is similarly reduced by an order of magnitude.

Although the present invention has been discussed in terms of driving a diode load device such as a PIN diode, it will be understood that the invention may be used to drive any load device, and particularly those load devices that store charge in a reversed bias condition. This includes all PN junctions, such as laser diodes, emitter-base junctions of a transistor, and the like.

Furthermore, while a two-level embodiment has been shown and described, the more general case comprises a plural-level source responsive to output voltage. Such plural-level current source can be constructed by cascading two-level sources. For instance, to construct a three-level current source the constant current source 68 in FIG. 3 can be replaced by a two-level current source responsive to the voltage on node n2. The additional two-level source may be composed of two additional transistors Q15' and Q17' (not shown) connected analogous to Q15 and Q17. A second control means (not shown) limits the maximum voltage on the base of Q15' so as to determine a second threshold output voltage at which the three-level current source would switch to a third output current level. When the output voltage across the current driver is largest, the output current is smallest. As the output voltage rises beyond the first threshold, Q15 turns off and the output current increases to a second level; as the output voltage rises beyond the second threshold, Q15' turns off and the output current increases to a third level. In this manner, a plural-level current source of a desired number of levels can be constructed by cascading a plurality of two-level current sources.

What is claimed is:

1. A current driver for supplying diode load means reverse-bias voltage in response to a first level of binary control signal, and for supplying said diode load means a forward-bias current in response to a second level of said binary control signal, said current driver comprising:

an output terminal and a reference terminal suitable for connecting said diode load means therebetween;

switch means having first, second, and third electrodes, said first level of binary control signal conditioning said switch means for conduction between the first and third electrodes thereof, said second level of binary control signal conditioning said switch means for non-conduction between the first and third electrodes thereof, said first electrode being suitable for receiving a source of reverse-bias voltage with respect to said reference terminal, the second electrode of said switch means being connected to said output terminal;

voltage sensing means connected to said output terminal for sensing the output voltage thereto, said voltage sensing means including means responsive to voltage on said output terminal for providing a first output signal whenever said output voltage is below a predetermined threshold voltage, and for providing a second output signal whenever said output voltage is above said predetermined threshold value; and a two-level current source supplying output current to said output terminal responsive to said second level of binary control signal, and not supplying output current to said output terminal responsive to said first level of binary control signal, supplying said output current at a first level to said diode load means responsive to said first output signal from said voltage sensing means and at a second level responsive to said second output signal from said voltage sensing means, said second current level being larger than said first current level and being sufficient to forward bias said diode load means.

2. A current source for selectively supplying load means a plurality of current levels, said current source comprising:

an output terminal and a reference terminal suitable for connecting said load means therebetween;

a first transistor having emitter, base, and collector electrodes, the emitter thereof being connected to said output terminal;

a power terminal for receiving an operating potential with respect to said reference terminal, the collector of said first transistor being connected to said power terminal;

a current source connected for supplying current to a first circuit node to which the base of said first transistor connects;

voltage sensing means connected to said output terminal for sensing the output voltage thereto, said voltage sensing means including means responsive to voltage on said output terminal for providing a first output level whenever said output voltage is below a predetermined threshold voltage and for providing a second output level whenever said output voltage is above said predetermined threshold voltage; and switch means responsive to said voltage sensing means, said switch means being conditioned for conduction responsive to said first output level of said voltage sensing means and conditioned for non-conduction responsive to said second output level of said output voltage sensing means, said switch means being connected for conducting current to divert current from the base of said first transistor to its emitter.

3. A current source according to claim 2 wherein said switch means and said voltage sensing means both include as a common element a second transistor having base, emitter, and collector electrodes, the collector of said second transistor being connected to the base of said first transistor, the emitter of said second transistor being connected to the emitter of said first transistor; and wherein said voltage sensing means further includes control means for maintaining a voltage on the base electrode of said second transistor equal to a predetermined limit voltage whenever the voltage on said output terminal exceeds a predetermined value substantially equal to said predetermined threshold voltage plus the forward-bias base-emitter voltage drop of said second transistor, said control means further supplying a current to the base electrode of said second transistor whenever the voltage on said output terminal is below said predetermined value.

4. A current source for selectively supplying load means a plurality of current levels, said current source comprising:

an output terminal and a reference terminal suitable for connecting said load means therebetween;

first, second, third, and fourth transistors having respective emitter, base, and collector electrodes, the emitter of said fourth transistor and the emitter of the third transistor being connected to said output terminal, said third and fourth transistors requiring voltages between their respective base and emitter electrodes that exceed substantially equal offset voltages for conditioning each of them to conduct between their respective collector and emitter electrodes;

a first circuit node to which the base and collector of said third transistor, and the emitter of said second transistor, and connected in common;

a second circuit node to which the base of said fourth transistor and the emitter of said first transistor are connected in common;

a power terminal for receiving an operating potential with respect to said reference terminal, the collector of said first transistor being connected to said power terminal;

a current source connected for supplying current to a third circuit node to which the base of said first transistor and the collector of the second transistor are connected;

control means for maintaining a voltage on the base electrode of said second transistor equal to a predetermined limit voltage whenever the voltage on said output terminal exceeds a predetermined value substantially equal to said predetermined threshold voltage plus the sum of the forward-bias base-emitter voltage drops of said second and third transistors, said control means further supplying a current to the base electrode of said second transistor whenever the voltage on said output terminal is below said predetermined value; and means for connecting said first circuit node to said second circuit node.

5. A current source as set forth in claim 4 arranged in combination with the following elements for providing a current driver for supplying diode load means a reverse bias voltage in response to a first level of binary control signal and for supplying said diode load means a forward bias current in response to a second level of binary control signal:

an input terminal suitable for receiving said binary control signal;

a first terminal for receiving a reverse bias voltage supply;

a fifth transistor having emitter, base, and collector electrodes, said fifth transistor having a principal current conduction path between its emitter and collector electrodes controlled by a signal on the base electrode thereof, said fifth transistor being connected to conduct current between said output terminal and said first terminal; and input means responsive to said binary control signal on said input terminal, said input means connected to each base of said first, second, third, fourth, and fifth transistors, said input means responsive to a first level of said binary control signal for conditioning said fifth transistor for conduction between its collector and emitter electrodes and conditioning said first, second, third, and fourth transistors for non-conduction between their respective collector and emitter electrodes, responsive to a second level of said binary control signal for conditioning said fifth transistor for non-conduction between its collector and emitter electrodes, and conditioning said first, second, third and fourth transistors to allow for conduction between their respective collector and emitter electrodes.

6. A current source according to claim 4 or 5 wherein said means for connecting said first circuit node to said second circuit node consists of a direct connection without substantial intervening impedance.

7. A current source according to claim 4 or 5 wherein said means for connecting said first circuit node to said second circuit node comprises a resistor.

8. A current source according to claim 3 or 4 or 5 wherein said control means comprises:

means for supplying current to a fourth circuit node to which the base of said second transistor connects; and a plurality of diodes connected in series to conduct current from said fourth circuit node to said reference terminal, said diodes providing a maximum voltage on the base electrode of said second transistor equal to said predetermined limit voltage.

* * * * *